United States Patent [19]
Yamada

[11] Patent Number: 5,583,570
[45] Date of Patent: *Dec. 10, 1996

[54] PHOTOELECTRIC CONVERSION SYSTEM

[75] Inventor: Hiroyasu Yamada, Hachioji, Japan

[73] Assignee: Casio Computer Co., Ltd., Tokyo, Japan

[*] Notice: The term of this patent shall not extend beyond the expiration date of Pat. No. 5,463,420.

[21] Appl. No.: 446,404

[22] Filed: May 22, 1995

Related U.S. Application Data

[63] Continuation of Ser. No. 133,563, Oct. 8, 1993, Pat. No. 5,463,420.

[30] Foreign Application Priority Data

Oct. 16, 1992 [JP] Japan .................... 4-304587

[51] Int. Cl.$^6$ .................... H04N 3/14; H04N 5/335
[52] U.S. Cl. .................... 348/294; 348/302; 348/304; 348/307; 348/309; 250/208.1
[58] Field of Search .................... 348/294, 302, 348/304, 307, 309; 250/208.1

[56] References Cited

U.S. PATENT DOCUMENTS

| | | | |
|---|---|---|---|
| Re. 34,309 | 7/1993 | Tanaka et al. | 358/213.31 |
| 4,556,908 | 12/1985 | Ida | 358/213 |
| 5,051,831 | 9/1991 | Hashimoto | 358/213.11 |
| 5,463,420 | 10/1995 | Yamada | 348/294 |

FOREIGN PATENT DOCUMENTS

| | | | |
|---|---|---|---|
| 62-104074 | 10/1987 | Japan | H01L 27/14 |
| 62-203365 | 2/1988 | Japan | H01L 27/14 |
| 62-198155 | 2/1988 | Japan | H01L 27/14 |
| 3-82171 | 6/1991 | Japan | H01L 31/10 |

Primary Examiner—Michael T. Razavi
Assistant Examiner—Bipin Shalwala
Attorney, Agent, or Firm—Frishauf, Holtz, Goodman, Langer & Chick

[57] ABSTRACT

A photosensor formed on an insulating substrate has a transparent top gate electrode arranged on the upper side of a semiconductor layer for photoelectric conversion and a bottom gate electrode arranged on the lower side of the semiconductor layer. If light is applied from the top gate electrode side in a state in which a bottom gate voltage $V_{BG}=+20$ V is applied to the bottom gate electrode and a top gate voltage $V_{TG}=-20$ V is applied to the top gate electrode, electron-hole pairs are generated in the semiconductor layer and only the holes are held in the semiconductor layer by the effect of the top gate voltage $V_{TG}=-20$ V. Therefore, an n-channel is formed in the semiconductor layer and a drain current $I_{DS}$ flows. It was confirmed that the drain current $I_{DS}$ will not flow even if illumination light is applied when the bottom gate voltage $V_{BG}$ is set at 0 V. Therefore, the selection or non-selection state of the photosensor can be controlled by the bottom gate voltage $V_{TG}$.

17 Claims, 8 Drawing Sheets

PHOTOELECTRIC CONVERSION SYSTEM

This is a continuation of application Ser. No. 08/133,563 filed Oct. 8, 1993 now U.S. Pat. No. 5,463,420 issued Oct. 31, 1995.

BACKGROUND OF THE INVENTION

1. Field of the Invention

This invention relates to a photoelectric conversion system having a photoelectric conversion device and a circuitry for driving the device.

2. Description of the Related Art

As a photoelectric conversion device, a MOSFET photocell and photodiode using a monocrystalline silicon, amorphous silicon, polycrystalline silicon or the like are known. A CCD is well known in the art as a system for transferring charges generated in the silicon bulk by application of light by scanning an electric field. Because of the charge transfer inside the bulk, in this system, a so-called semiconductor thin film deposition technique for forming a photoelectric conversion device on the insulating substrate cannot be used and this system is not suitable for a photo device of large area.

An area type photo-array can be formed by arranging photodiodes or MOS photocells on the insulating substrate in a matrix form. In this case, each of the photodiodes or MOS photocells is connected to a switching element such as a MOS TFT and charges stored on the respective photodiodes or MOS photocells are sequentially read out at preset timings.

A novel photosensor with TFT structure is proposed by the inventor of this application. This invention is disclosed in Japanese Patent Application KOKAI publication No. 3-82171, and the outline thereof is explained with reference to FIGS. 9 and 10.

FIG. 9 is an enlarged cross sectional view of a photosensor 1. The photosensor 1 has a structure having a bottom gate electrode 3, bottom gate insulating film 4, photoelectric conversion semiconductor layer 5 formed of amorphous silicon, source electrode 6, drain electrode 7, top gate insulating film 9 and top gate electrode 10 laminated in this order on a transparent glass substrate 2. The top gate electrode 10 and top gate insulating film 9 are transparent. The source electrode 6 and drain electrode 7 are separated from each other so that light can be illuminated on that portion of the semiconductor layer 5 which lies between the edge portions of the electrodes 6 and 7. Illumination light A is illuminated from the top gate electrode 10 side of the photosensor 1. The operation of the photosensor is explained with reference to FIG. 10.

FIG. 10 shows characteristic curves showing the relation between a drain current $I_D$ and a top gate voltage $V_{TG}$ applied to the top gate electrode 10 using the presence and absence of the illumination light A as parameters in a condition that a bottom gate voltage $V_{BG}=+20$ V is applied to the bottom gate electrode 3 and a drain voltage $V_d=+10$ V is applied between the source electrode 6 and the drain electrode 7. In FIG. 10, the characteristic curve $C_O$ indicates a case of no light illumination and the characteristic curve $C_L$ indicates a case of light illumination.

In the case of no light illumination, n-channels are formed in both of the upper and lower surface regions of the semiconductor layer 5 when the top gate voltage $V_{TG}=+40$ V. As a result, a drain current $I_D$ of several tens micro A (Ampere) can be obtained. The drain current $I_D$ becomes smaller as the top gate voltage $V_{TG}$ becomes lower, and it becomes smaller than $10^{-14}$ A when the top gate voltage $V_{TG}$ becomes approximately equal to $-20$ V. This is considered to be because the n-channel formed in the lower surface of the semiconductor layer 5 by application of the bottom gate voltage $V_{BG}=+20$ V is cancelled by application of the top gate voltage $V_{TG}=-20$ V. In the case of light illumination, a drain current $I_D$ which is as large as several tens micro A as in the case of no light illumination flows at the time of application of the top gate voltage $V_{TG}=+40$ V as might be expected. Unlike the case of no light illumination, the drain current $I_D$ will not be significantly reduced when the top gate voltage $V_{TG}$ is lowered and a current of approx. 1 micro A will flow even when the top gate voltage $V_{TG}$ is lowered to $-40$ V. Therefore, in the photosensor 1, an excellent characteristic in which the ratio of a current (light current) in the case of light illumination to a current (dark current) in the case of no light illumination is set to a number in seven figures can be obtained.

However, even in the photosensor, only the signal-to-noise ratio can be increased, and like the conventional photodiode and MOS photocell, a switching element for reading out stored charges is required.

This invention is made in the above-described situations and an object of this invention is to provide a photoelectric conversion system which can be designed such that the photosensor itself will have both of the photoelectric conversion function and the readout selection function.

SUMMARY OF THE INVENTION

According to this invention there is provided a photoelectric conversion system comprising a photosensor including a semiconductor layer having a photoelectric conversion function, source and drain electrodes separately disposed on the semiconductor layer, a first gate electrode disposed on one surface side of the semiconductor layer, and a second gate electrode disposed on the other surface side of the semiconductor layer, at least one of the first and second gate electrodes having a light transmission property;

sense state controlling means for applying a voltage to one of the first and second gate electrodes to control a state in which charges generated in the semiconductor layer by application of illumination light are held and a state in which the charges are not held; and selection controlling means for applying a voltage to the other of the first and second gate electrodes to control a selection state in which charges generated in the semiconductor layer by application of illumination light are read out from the drain electrode and a non-selection state in which the charges are not read out.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed descrip tion of the preferred embodiments given below, serve to explain the principles of the invention.

DETAILED DESCRIPTION OF THE PREFERRED EMBODIMENTS

There will now be described embodiments of this invention with reference to the accompanying drawings.

Figure 1:
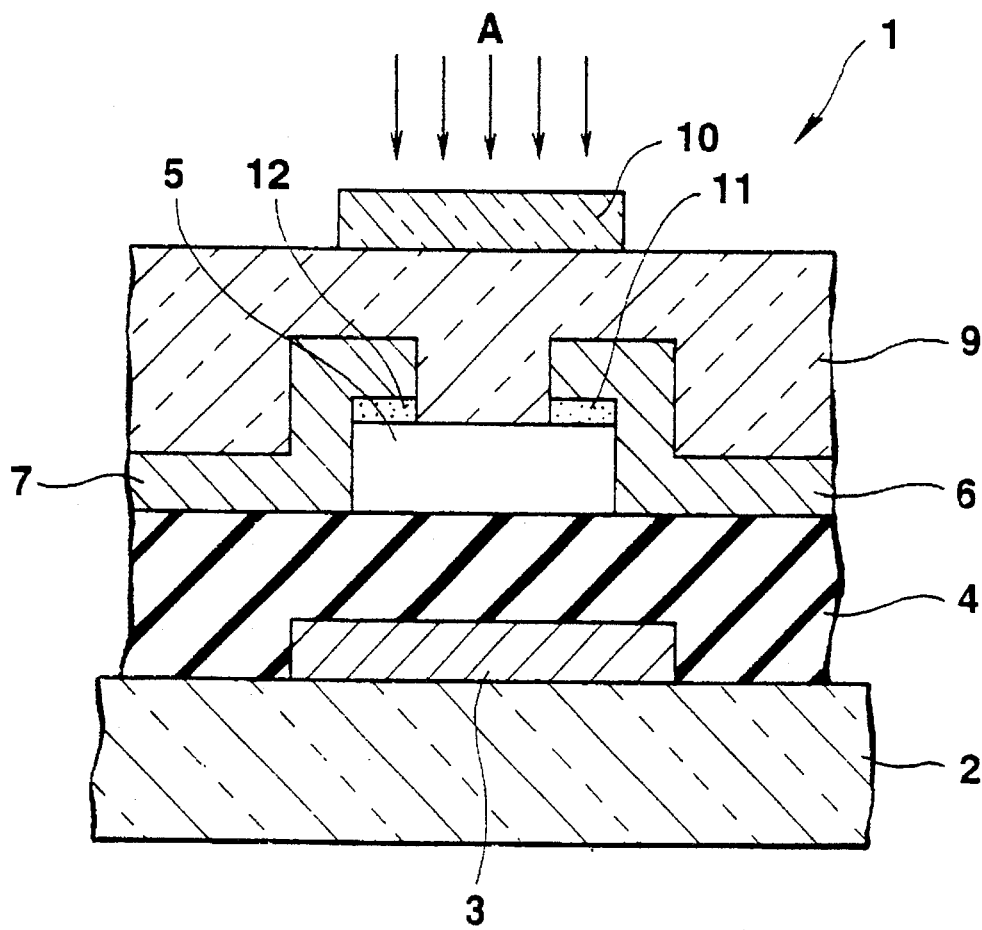
FIG. 1 is an enlarged cross sectional view of a photosensor applied to one embodiment of a photosensor system according to this invention.
Figure 2:
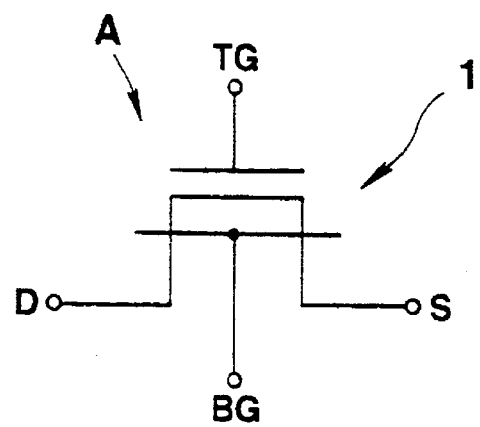
FIG. 2 shows an equivalent circuit of the photosensor shown in FIG. 1.
Figure 3:
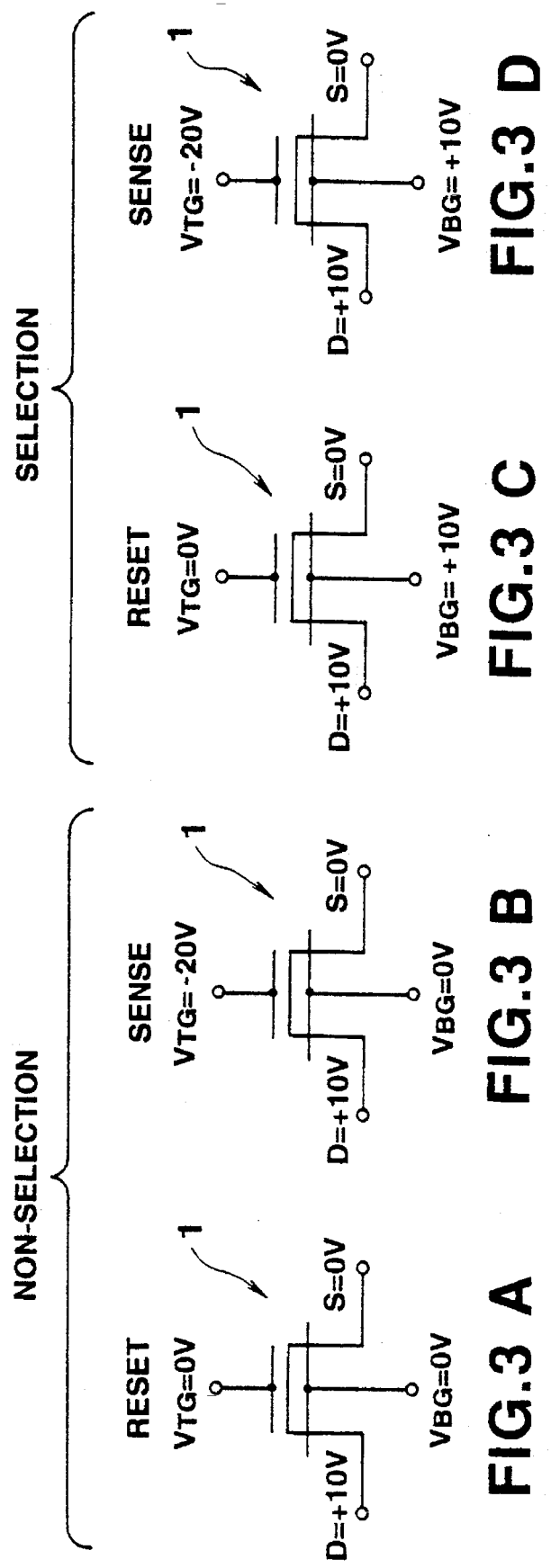
FIGS. 3A to 3D show a diagram for illustrating voltages applied to electrodes of the photosensor shown in FIG. 1 and the status variation thereof.
Figure 4:
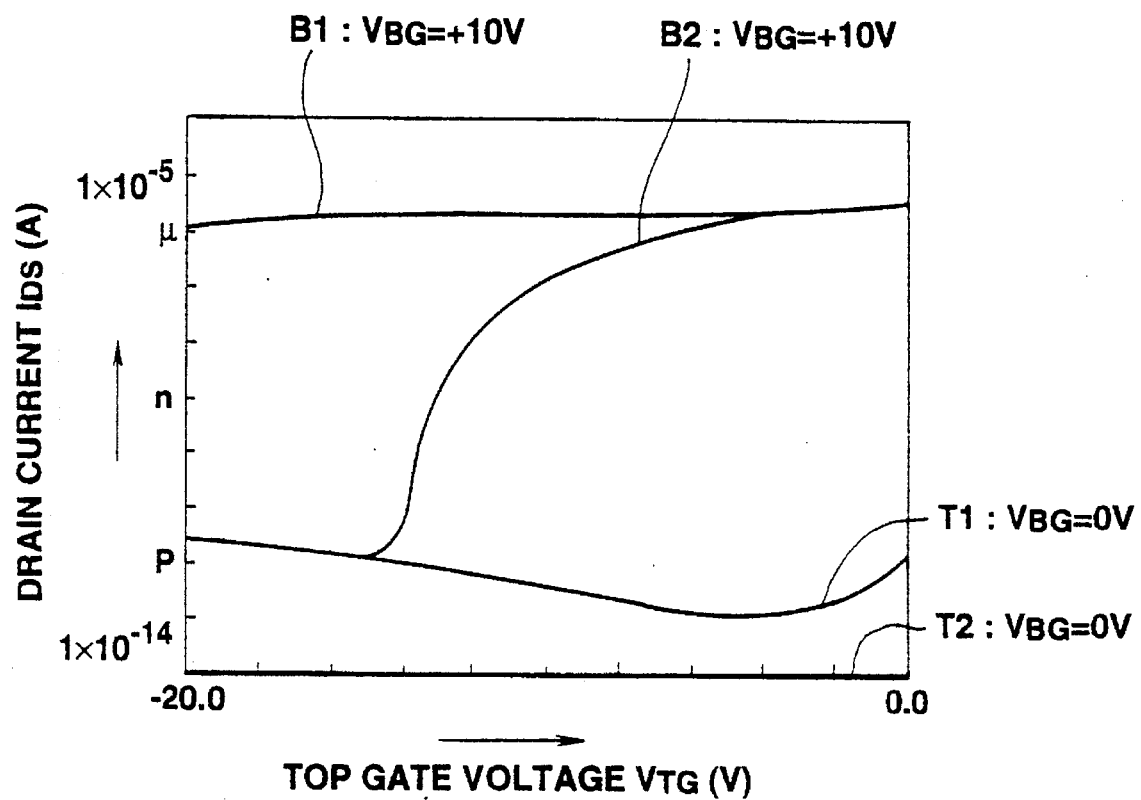
FIG. 4 is a characteristic diagram showing output characteristics in the voltage applying state of FIG. 3.
Figure 5:
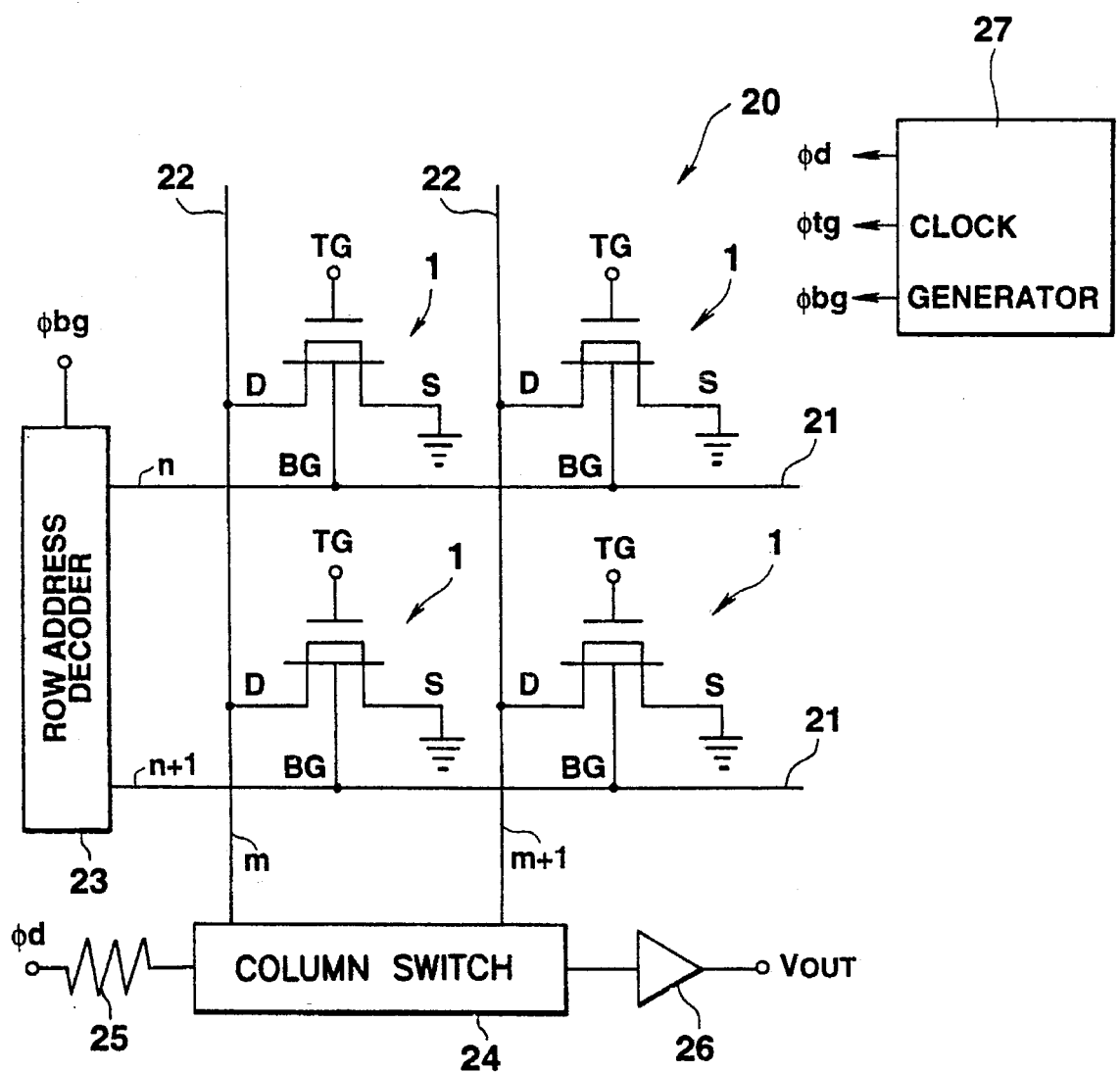
FIG. 5 is a circuit diagram showing part of an example of a sensor array in which the same photosensors as the photosensor shown in FIG. 1 are used.
Figure 6:
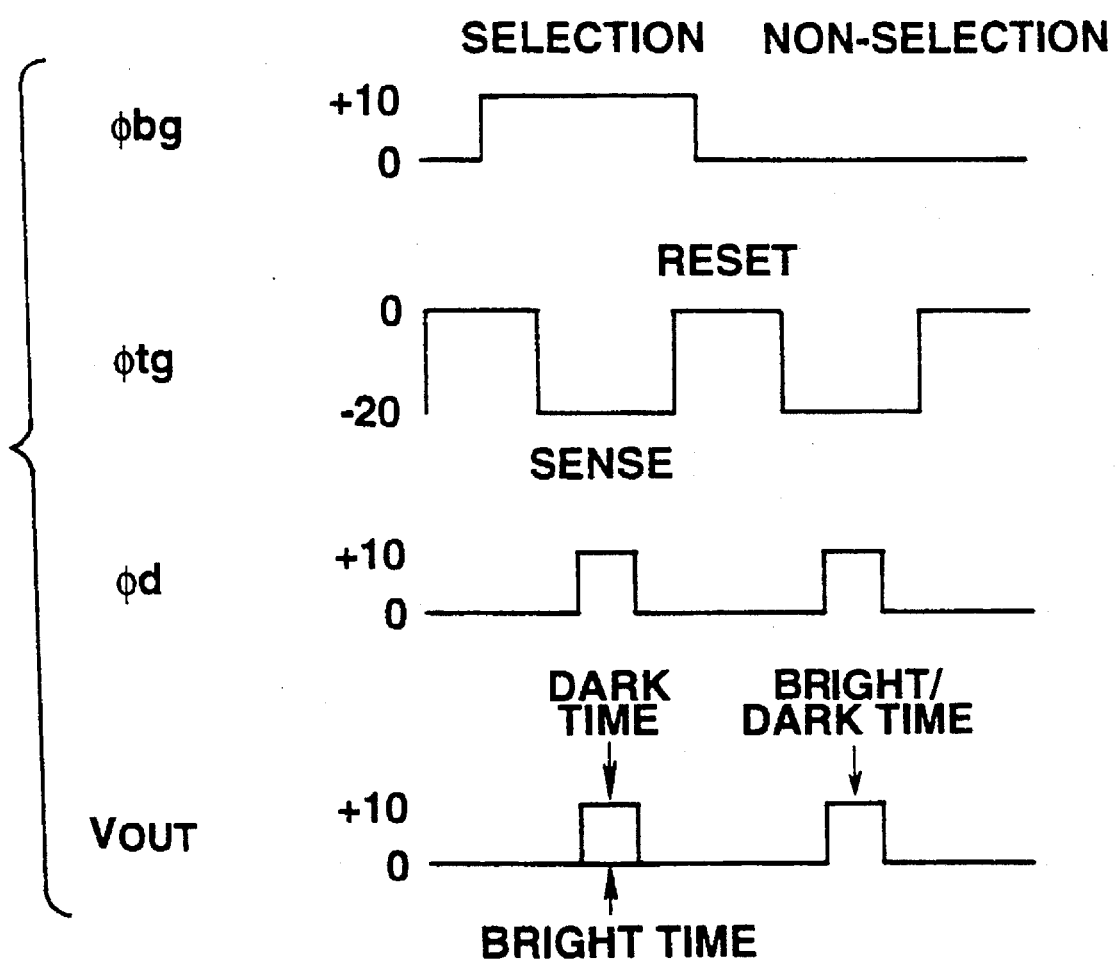
FIG. 6 is a timing chart showing the relation between voltages applied to various portions of the sensor array of FIG. 5 and an output signal.

FIGS. 1 to 6 illustrate one embodiment of a photosensor system according to this invention, and FIG. 1 is an enlarged cross sectional view of a photosensor used in the photosensor system, FIG. 2 shows an equivalent circuit of the photosensor shown in FIG. 1, FIGS. 3A to 3D is a diagram for illustrating voltages applied to various electrodes of the photosensor shown in FIG. 1 and the status variation thereof, FIG. 4 is a characteristic diagram showing output characteristics in the voltage applying state of FIGS. 3A to 3D; FIG. 5 is a circuit diagram showing part of an example of a sensor array using the above photosensors, and FIG. 6 is a timing chart showing the relation between voltages applied to various portions of the sensor array of FIG. 5 and an output signal.

Figure 9:
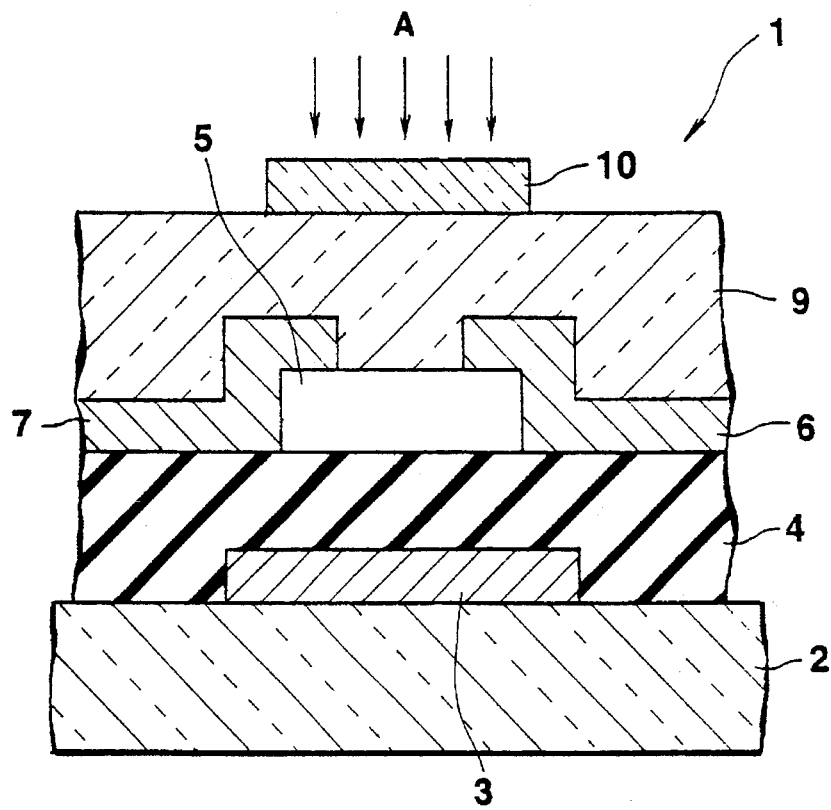
FIG. 9 is an enlarged cross sectional view showing the conventional photosensor.
Figure 10:
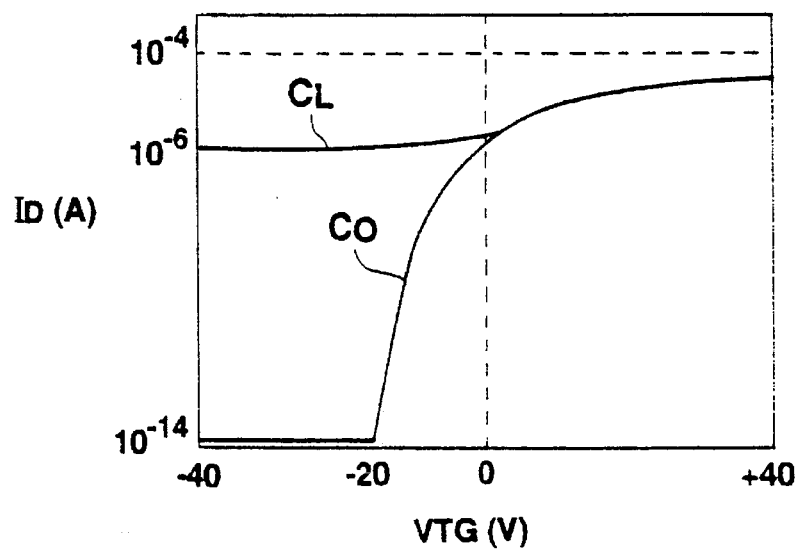
FIG. 10 is a characteristic diagram showing the output characteristic of the photosensor of FIG. 9.

As shown in FIG. 1, a photosensor 1 has a basic structure obtained by combining an inverted stagger type thin film transistor and a coplanar type thin film transistor with the semiconductor layers thereof used as a single layer. The basic structure of the photosensor 1 is similar to that of the conventional photosensor shown in FIG. 9 and like portions are denoted by the same reference numerals and the detail explanation therefor is omitted.

The photosensor 1 has a bottom gate electrode 3 formed on a transparent insulative substrate 2 formed of glass or the like and a bottom gate insulating film 4 formed of silicon nitride (SiN) to cover the bottom gate electrode 3 and insulative substrate 2. A semiconductor layer 5 is formed in position above the bottom gate electrode 3 to face the bottom gate electrode 3 and the semiconductor layer 5 is formed of i-type amorphous silicon (i-a-Si). A source electrode 6 and a drain electrode 7 are formed on both sides of the semiconductor layer 5 and in positions on the semiconductor layer 5 to face each other with a preset distance set therebetween and the source electrode 6 and the drain electrode 7 are connected to the semiconductor layer 5 via respective $n^+$silicon layers 11 and 12 formed of amorphous silicon diffused with dopant such as phosphorus. A bottom transistor (inverted stagger type thin film transistor) is constructed by the above elements.

The source electrode 6, drain electrode 7 and a portion of the semiconductor layer 5 which lies between the source electrode 6 and drain electrode 7 are covered with a transparent top gate insulating film 9 formed of silicon nitride and a top gate electrode 10 is formed of transparent conductive material in a position to face the bottom gate electrode 3. The top gate electrode 10 is preferably formed with such a size as to cover not only the channel region of the semiconductor layer 5 but also the $n^+$silicon layers 11, 12 as shown in FIG. 1 so as to generate electron-hole pairs as will be described later. Although not shown in the drawing, a transparent overcoat film formed of silicon nitride is formed to cover the top gate electrode 10 and the top gate insulating film 9 so as to protect them. A top transistor (coplanar transistor) is constructed by the top gate electrode 10, top gate insulating film 9, semiconductor layer 5, source electrode 6 and drain electrode 7.

As shown in FIG. 1, in this embodiment, the photosensor 1 is applied with illumination light A from the top gate electrode 10 side and the illumination light A is applied to the semiconductor layer 5 via the top gate electrode 10 and top gate insulating film 9. As will be clearly understood from the above structure, if the bottom gate electrode 3 and bottom gate insulating film 4 of the photosensor 1 are formed of transparent material, it becomes possible to apply the illumination light A from the bottom gate electrode 3 side and the operation described below can be effected in the same manner.

For example, the photosensor 1 is formed such that the bottom gate electrode 3 is 500 angstroms thick, the bottom gate insulating film 4 is 2000 angstroms thick, the semiconductor layer 5 is 1500 angstroms thick, the source electrode 6 and drain electrode 7 are 500 angstroms thick, the ohmic contact layers 11 and 12 are 250 angstroms thick, the top gate insulating film 9 is 2000 angstroms thick, the top gate electrode 10 is 500 angstroms thick, and the overcoat film (not shown) is 2000 angstroms thick, and the distance between the source electrode 6 and the drain electrode 7 on the semiconductor layer 5 is 7 micron.

Thus, the photosensor 1 has a structure obtained by combining the inverted stagger type thin film transistor and coplanar type thin film transistor and the equivalent circuit thereof shown in FIG. 2 can be obtained. In FIG. 2, BG denotes a back gate electrode, TG denotes a top gate electrode, S denotes a source electrode, D denotes a drain electrode, and the operation is explained in the following by using the above reference numerals.

when a positive voltage, for example, +10 V is applied to the bottom gate electrode BG of the photosensor 1, an n-channel is formed in the bottom transistor. At this time, when a positive voltage, for example, +10 V is applied between the source electrode S and the drain electrode D, electrons are supplied from the source electrode S side, causing a current to flow. In this condition, if a negative voltage of level for extinguishing the channel by an electric field created by the bottom gate electrode BG, for example, −20 V is applied to the top gate electrode TG, the electric field from the top gate electrode TG acts to reduce the influence given to the channel region by the electric field created by the bottom gate electrode BG, and as a result, a depletion layer extends in the thickness direction of the semiconductor layer 5 to pinch off the n-channel. At this time, if illumination light A is applied from the top gate electrode TG side, electron-hole pairs are generated on the top gate electrode TG side of the semiconductor layer 5. In this case, since −20 V is applied to the top gate electrode TG, induced holes are stored in the channel region to extinguish the electric field created by the top gate electrode TG. For this reason, an n-channel is restored in the channel region of the semiconductor layer 5, causing a current to flow. A current (which is hereinafter referred to as a drain current) $I_{DS}$ flowing between the source electrode S and the drain electrode D varies according to an amount of illumination light A.

Thus, since the photosensor 1 controls the electric field from the top gate electrode TG to prevent formation of a channel to be formed by the electric field from the bottom gate electrode BG side and pinch off the n-channel, the drain current $I_{DS}$ flowing at the time of no light illumination can be suppressed to an extremely small value, for example, approx. $10^{-14}$ A. As a result, in the photosensor 1, a difference between the drain current at the time of light illumination and the drain current at the time of no light illumination can be made sufficiently large, and the amplification factor of the bottom transistor varies with an amount of illuminated light and the S/N ratio can be made large.

Further, in the photosensor 1, if the top gate electrode TG is set to, for example, 0 V in a state that a positive voltage of +10 V is applied to the bottom gate electrode BG, holes are discharged from the trap level between the semiconductor layer 5 and the top gate insulating film 9 to effect the refresh operation, that is, resetting operation. More specifically, when the photosensor 1 is continuously used, the trap level between the semiconductor layer 5 and the top gate insulating film 9 is filled with holes generated by light illumination and holes injected from the drain electrode D, the channel resistance in the no light illumination state becomes small, and the drain current increases at the time of no light illumination. Then, 0 V is applied to the top gate electrode TG to discharge the holes, thus effecting the resetting operation. In this case, it is possible to effect the resetting operation when a negative voltage is applied as a voltage applied to the top gate electrode TG.

Further, when a positive voltage is not applied to the bottom gate electrode BG in the photosensor 1, no channel is formed in the bottom transistor so that a drain current will not flow even when light is illuminated, thereby setting a non-selection state. That is, the photosensor 1 can control the selection state and non-selection state by controlling the voltage $V_{BG}$ applied to the bottom gate electrode BG. Further, when 0 V is applied to the top gate electrode TG in the non-selection state, holes are discharged from the trap level between the semiconductor layer 5 and the top gate insulating film 9 to effect the resetting operation in the same manner as described above.

Next, the above operation is explained with reference to FIGS. 3A to 3D showing the relation between voltages applied to the electrodes of the photosensor 1 and FIG. 4 showing a drain current characteristic curve obtained at this time. FIG. 4 shows the drain current characteristic obtained when a top gate voltage $V_{TG}$ applied to the top gate electrode TG is changed with respect to the bottom gate voltage $V_{BG}$ applied to the bottom gate electrode BG and the presence and absence of illumination light A as parameters.

The two states shown by FIGS. 3A and 3B are the same in that the back gate voltage $V_{BG}$ is 0 V. The states correspond to the drain current characteristic curve T1 obtained when the illumination light A is applied (at the bright time) and the drain current characteristic curve T2 obtained when the illumination light A is not applied (at the dark time). That is, in this state, even when the top gate voltage $V_{TG}$ is changed in a range of 0 V to −20 V, or irrespective of the presence or absence of the illumination light A, the drain current $I_{DS}$ remains below 10 pA and the photosensor 1 is set in the non-selection state. The drain current $I_{DS}$ at the dark time is less than $10^{-14}$ A and the drain current characteristic curve T2 in FIG. 4 lies below the lower limit in FIG. 4.

The states shown by FIGS. 3C and 3D are the same in that the back gate voltage $V_{BG}$ is +10 V. In this state, even if light is applied and the top gate voltage $V_{TG}$ is changed from 0 V to −20 V, the drain current $I_{DS}$ of more than 1 microampere always flows as shown by the drain current characteristic curve B1 at the bright time in FIG. 4, thus detecting light illumination. Further, when the illumination light A is not applied to the photosensor 1, a drain current $I_{DS}$ of less than 10 pA flows with the top gate voltage $V_{TG}$ set equal to or less than −14 V as shown by the drain characteristic curve B2 at the dark time in FIG. 4 and the drain current $I_{DS}$ increases when the top gate voltage $V_{TG}$ is set higher than the above value −14 V.

Therefore, as shown in FIGS. 3A to 3D, in the photosensor 1, the sense state and reset state can be controlled by controlling the top gate voltage $V_{TG}$ to 0 V and −20 V and the selection state and non-selection state can be controlled by controlling the bottom gate voltage $V_{BG}$ to 0 V and +10 V, for example. As a result, it becomes possible to operate the photosensor 1 as a photosensor having the photosensor function and the selection transistor function by controlling the top gate voltage $V_{TG}$ and bottom gate voltage $V_{BG}$.

The photosensor 1 is applied to a sensor array 20 shown in FIG. 5 by utilizing the feature that it has the photosensor function and the selection transistor function.

That is, the sensor array 20 is constructed by arranging a large number of photosensors 1 in a matrix form and FIG. 5 shows an area in which n-th and (n+1)-th photosensors 1 in the row direction and m-th and (m+1)-th photosensors 1 in the column direction are arranged. The bottom gate electrodes BG of the photosensors 1 are connected to respective driving lines 21 disposed to extend in the row direction and the drain electrodes D thereof are connected to respective signal lines 22 disposed to extend in the column direction. The driving lines 21 are connected to a row address decoder 23 which is a vertical scanning circuit and the signal lines 22 are connected to a column switch 24 which is a horizontal scanning circuit. The row address decoder 23 applies a bottom gate voltage $\phi_{bg}$ to the bottom gate electrodes BG of the photosensors 1 arranged for each row via the corresponding driving lines 21. The bottom gate voltage $\phi_{bg}$ is switched between 0 V and +10 V as shown in FIG. 6. Further, the column switch 24 applies a drain voltage $\phi_d$ of 5 V to the drain electrodes D of the photosensors 1 arranged for each column via the corresponding signal lines 22. The drain voltage $\phi_d$ is supplied to the column switch 24 via a pull-up resistor 25. A buffer 26 is connected to the output terminal of the column switch 24 and an output signal $V_{OUT}$ of each of the photosensors 1 is output via the buffer 26. That is, the pull-up resistor 25 is connected in series with the signal lines 22 and a value determined by the resistance ratio with the output resistance of each of the photosensors 1 is used as an input to the next stage buffer. Further, a top gate voltage $\phi_{tg}$ is applied from a preset voltage supply circuit or a clock generator 27 to the top gate electrodes TG of the photosensors 1 and the top gate voltage $\phi_{tg}$ is switched between 0 V and −20 V as shown in FIG. 6. The source electrodes S of the photosensors 1 are grounded. Voltages $\phi_{bg}$ and $\phi_d$ are supplied from the clock generator 27.

With the circuit construction shown in FIG. 5, the selection/non-selection state and the sense/reset state are controlled by controlling the bottom gate voltage $\phi_{bg}$, top gate voltage $\phi_{tg}$ and drain voltage $\phi_d$ as shown in FIG. 6.

That is, if the top gate voltage $\phi_{tg}$ of one of the photosensors 1 is set to 0 V to set up the reset state and then the top gate voltage $\phi_{tg}$ is set to −20 V and the bottom gate voltage $\phi_{bg}$ is set to 10 V as shown in FIG. 6, the photosensor 1 is set into the selection state as shown by FIG. 3D. In a case where the top gate voltage $\phi_{bg}$ is set to −20 V to set up the sense state after the photosensor 1 is set into the selection state, the value of an output signal $V_{OUT}$ varies according to whether the illumination light A is applied or not, that is, whether it is bright time or dark time when the data readout operation is effected while the drain voltage $\phi_d$ is kept at +10 V for a preset period of time. That is, at the bright time, the photosensor 1 set in the sense state is set into the ON state since holes are stored in the channel region of the semiconductor layer 5 to form an n-channel by application of the illumination light A. Therefore, the drain voltage $\phi_d$ applied to the signal line 22 is discharged into the ground via the photosensor 1. As a result, an output signal $V_{OUT}$ of 0 V is output. On the other hand, at the dark time, since no n-channel is formed in the photosensor 1 and the photosensor 1 is set in the OFF state, a voltage of +10 V which is the drain voltage $\phi_d$ is output as it is as an output signal $V_{OUT}$.

After this, when the top gate voltage $\phi_{tg}$ is set to 0 V as shown in FIG. 6, the photosensor 1 is set into the reset state. Then, when the bottom gate voltage $\phi_{bg}$ is set to 0 V, the photosensor 1 is set into the non-selection state, and in this state, the top gate voltage $\phi_{tg}$ is set to −20 V to set up the sense state. Then, in the sense state, even if the drain voltage $\phi_d$ is set to 10 V, even if the illumination light A is applied, or even if the illumination light A is not applied, the output signal $V_{tg}$ is kept at the same level of +10 V obtained at the dark time in the selection state. That is, even if the top gate voltage $\phi_{tg}$ is set to −20 V to set up the sense state, the photosensor 1 can be set into the non-selection state irrespective of application of the illumination light A by setting the bottom gate voltage $\phi_{bg}$ to 0 V. Further, as is clearly seen from FIG. 6, the reset state can be set up irrespective of the bottom gate voltage $\phi_{bg}$ by setting the top gate voltage $\phi_{tg}$ to 0 V and an output signal $V_{OUT}$ can be stably derived from the photosensor 1 in the next data readout process.

Figure 7:
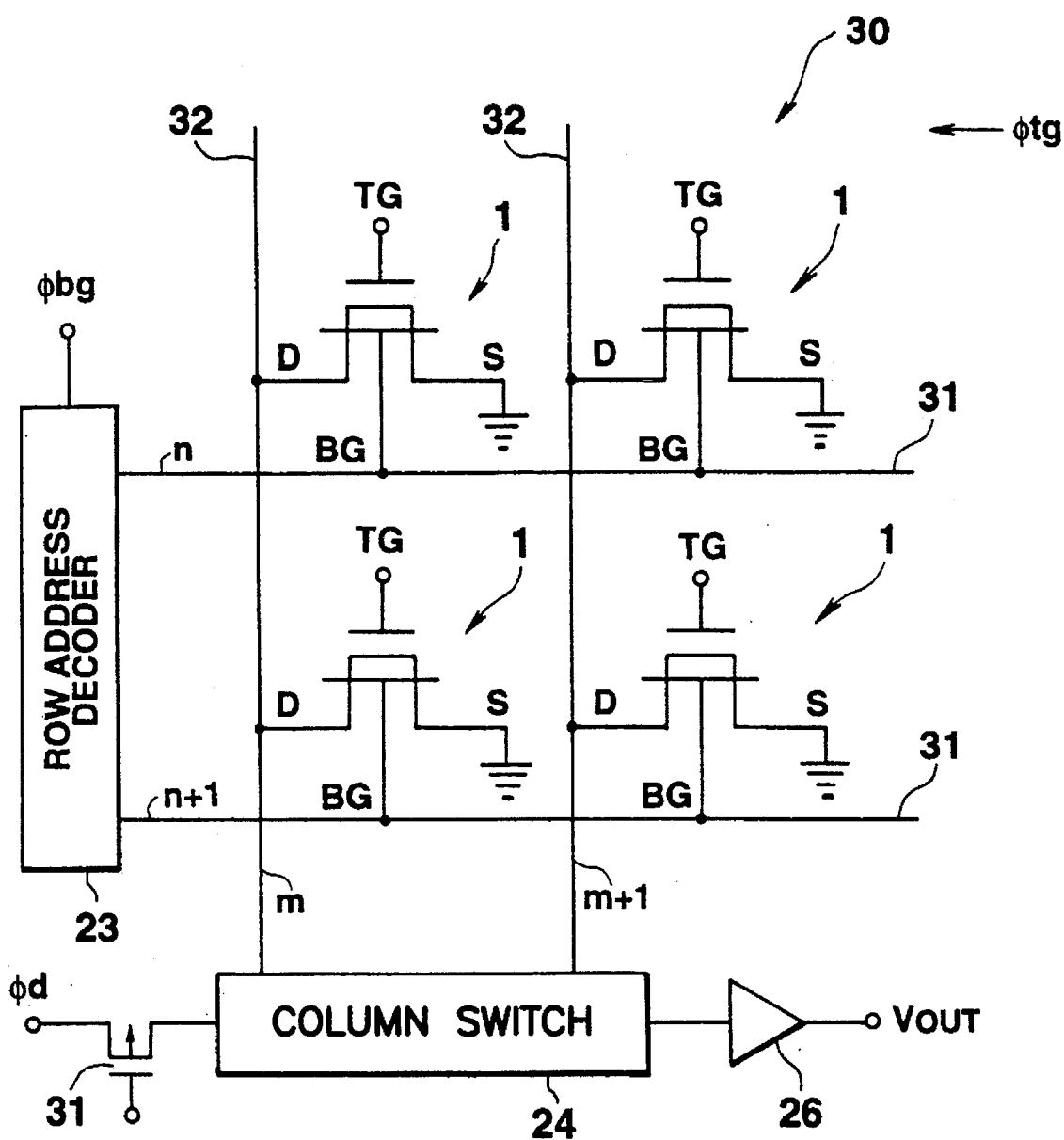
FIG. 7 is a circuit block diagram showing part of another example of a sensor array in which the same photosensors as the photosensor shown in FIG. 1 are used.

FIG. 7 is a diagram showing an example in which the photosensor 1 is applied to another sensor array 30. The sensor array 30 shown in FIG. 7 is similar to that of FIG. 5 except that the drain voltage $\phi_d$ is supplied to the column switch 24 via a precharge transistor 31 which may be formed of a P-MOSFET or the like and is controlled to the ON or OFF state by a precharge voltage $\phi_{pg}$.

Figure 8:
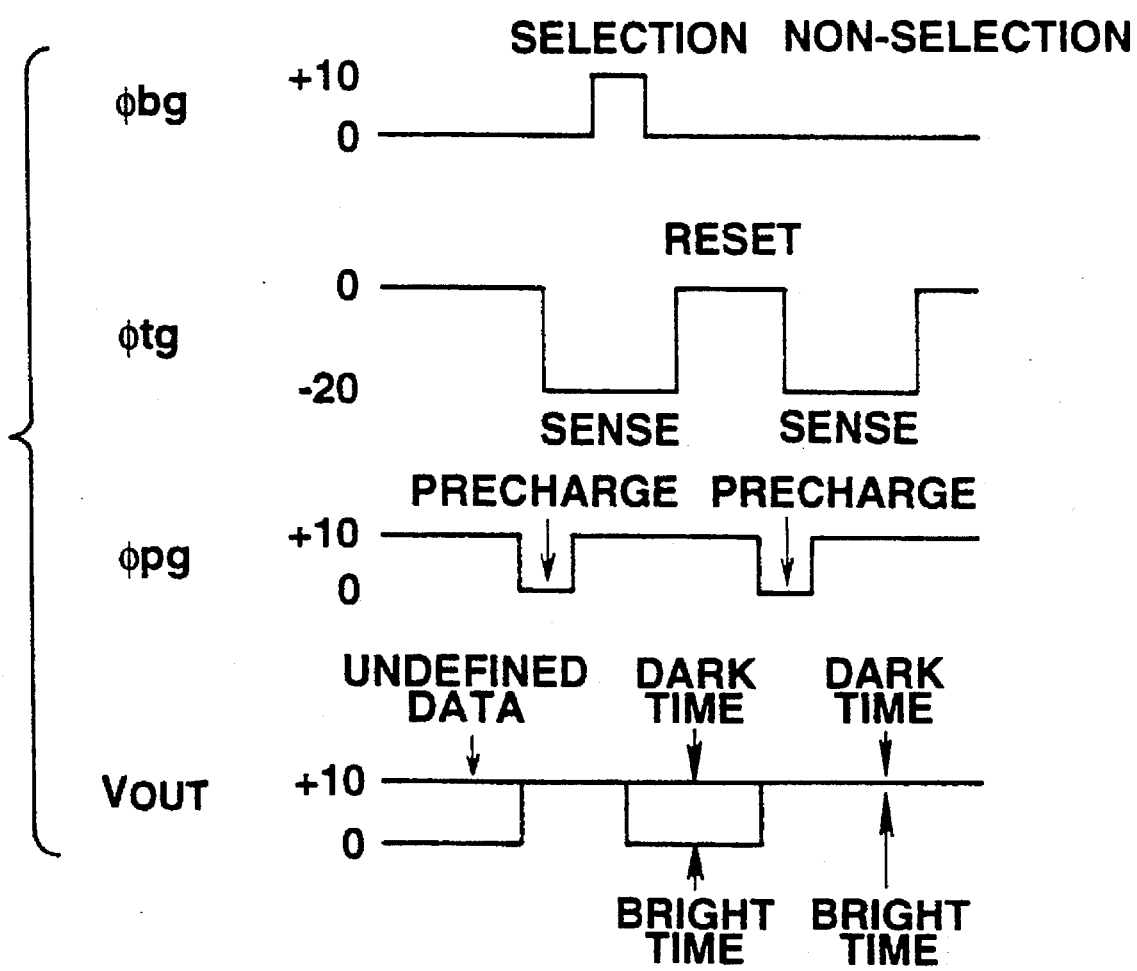
FIG. 8 is a timing chart showing the relation between voltages applied to various portions of the sensor array of FIG. 5 and an output signal.

FIG. 8 is a timing chart for illustrating the operation of the sensor array 30 and the operation thereof is explained below.

The top gate voltage $\phi_{tg}$ of the photosensor 1 is set to 0 V and the bottom gate voltage $\phi_{bg}$ is set to 0 V to set up the reset state, and in the reset state, a precharge voltage $\phi_{pg}$ is applied to the precharge transistor 31 for a preset period of time so as to apply a drain voltage $\phi_d$ to the signal lines 32 and precharge the same. After this, the top gate voltage $\phi_{tg}$ is set to −20 V to set the photosensor 1 into the sense state, and in the sense state, if the bottom gate voltage $\phi_{bg}$ is set to 10 V, the photosensor 1 is set into the selection state.

When the photosensor 1 is set into the selection state, the value of the output signal $V_{OUT}$ is changed according to the bright time or dark time. That is, at the bright time, the photosensor 1 is set into the ON state by application of the illumination light A and the output signal $V_{OUT}$ is changed to 0 V. On the other hand, at the dark time, since the photosensor 1 is not turned ON, a voltage of +10 V in the precharged state is output as an output signal $V_{OUT}$ as it is.

After this, if the bottom gate voltage $\phi_{bg}$ is set to 0 V as shown in FIG. 8, the non-selection state is set up, and in the non-selection state, if the top gate voltage $\phi_{tg}$ is set to 0 V, the photosensor 1 is set into the reset state. Then, in the reset state, the precharging operation is effected with the precharge voltage $\phi_{pg}$ set at 0 V. The sense state is set up by setting the top gate voltage $\phi_{tg}$ to −20 V in the precharged state. In the sense state, since the bottom gate voltage $\phi_{bg}$ is 0 V, the output signal $V_{OUT}$ is kept at the same voltage of +10 V as an output obtained at the dark time in the selection state even if the illumination light A is applied or even if the illumination light A is not applied. That is, even if the top gate voltage $\phi_{tg}$ is set to −20 V to set up the sense state after the precharging operation is effected, the photosensor 1 can be kept in the non-selection state irrespective of application of the illumination light A by setting the bottom gate voltage $\phi_{bg}$ at 0 V. Further, as is clearly understood from FIG. 8, the reset state can be set up irrespective of the bottom gate voltage $\phi_{bg}$ by setting the top gate voltage $\phi_{tg}$ at 0 V, and thus, an output signal $V_{OUT}$ can be stably derived from the photosensor 1 in the next data readout process.

In the photosensor system having the above photosensors, since the sense state controlling means controls a voltage applied to the gate electrode on the light illumination side arranged on one side of the semiconductor layer to control the sense state of the photosensor and the selection controlling means controls a voltage applied to the gate electrode arranged on the side opposite to the semiconductor layer to control the selection and non-selection states of the photosensor, both of the photosensor function and the selection transistor function can be simultaneously attained, thus making it possible to omit selection transistors separately provided in the prior art for selecting the photosensors. As a result, the size of the photosensor system itself can be reduced, thereby attaining pixels of high density.

Further, if a voltage applied to the gate electrode on the light illumination side is controlled by the sense state controlling means to control the set and reset states of the photosensor, charges stored in the preceding cycle can be rapidly discharged so that the amount of illumination light can be continuously detected.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A photoelectric conversion system comprising:
   a photosensor including a semiconductor layer having at least first and second portions highly doped with n-type impurities and a third portion having a photoelectric conversion function, source and drain electrodes separately connected to said first and second portions of said semiconductor layer, a first gate electrode disposed on one surface side of said semiconductor layer, and a second gate electrode disposed on the other surface side of said semiconductor layer, at least one of said first and second gate electrodes having a light transmission property;

sense state controlling means for applying voltages to said first gate electrode to control a hold state in which charges generated in said semiconductor layer by application of illumination light are held and a non-hold state in which the charges are not held; and selection controlling means for alternately applying a selection voltage and a non-selection voltage to said second gate electrode to set up a selection state in which charges generated in said semiconductor layer by application of illumination light are read out from said drain electrode and set up a non-selection state in which charges are not read out;

wherein a drain current corresponding to charges generated in said semiconductor layer of said photosensor in said non-selection state in a case of illumination light is the same or less than that in said selection state in a case of no illumination light, and a ratio of a drain current in said selection state in a case of illumination light and that in said non-selection state in the case of illumination light is $1 \times 10^4$ or greater; and wherein said state in which the charges generated in said semiconductor layer are held is set up when a voltage applied to said first gate electrode by said sense state controlling means is negative.

2. A photoelectric conversion system according to claim 1, wherein no impurity is doped in said third portion of said semiconductor layer, in which charges are generated in response to the illumination light.

3. A photoelectric conversion system according to claim 1, wherein said source and drain electrodes include portions for cutting out the illumination light incident to said first and second portions of said semiconductor layer.

4. A photoelectric conversion system according to claim 1, wherein said semiconductor layer is formed of amorphous silicon.

5. A photoelectric conversion system according to claim 1, wherein said non-hold state in which the charges generated in said semiconductor layer are not held is set up when a voltage applied to said first gate electrode by said sense state controlling means is 0 or positive.

6. A photoelectric conversion system according to claim 1, wherein a reset state in which the charges stored in said semiconductor layer are discharged from said semiconductor layer is set up when a voltage applied to said first gate electrode by said sense state controlling means is 0 or positive.

7. A photoelectric conversion system according to claim 1, wherein said selection state in which the charges generated in said semiconductor layer are read out from said drain electrode is set up when said selection voltage applied to said second gate electrode by said selection controlling means is positive.

8. A photoelectric conversion system according to claim 6, wherein said non-selection state is set up when said non-selection voltage applied to said second gate electrode by said selection controlling means is 0 or negative.

9. A photoelectric conversion system comprising:

at least one driving line;

a plurality of signal lines;

photosensors arranged to respectively correspond to said plurality of signal lines, each of said photosensors including a semiconductor layer having at least first and second portions highly doped with n-type impurities and a third portion having a photoelectric conversion function, source and drain electrodes separately connected to said first and second portions of said semiconductor layer, one of said source and drain electrodes being connected to a corresponding one of said signal lines, a first gate electrode which is transparent and disposed on one surface side of said semiconductor layer, and a second gate electrode disposed on the other surface side of said semiconductor layer and connected to said driving line;

column switching means for selecting one of said plurality of signal lines;

sense state controlling means for selectively applying a sense voltage and a reset voltage to said first gate electrode to control a sense state in which charges generated in said semiconductor layer by application of illumination light are held and a reset state in which the charges are discharged; and selection controlling means for selectively applying a selection voltage and a non-selection voltage to said second gate electrode through said driving line to control a selection state in which charges generated in said semiconductor layer by application of illumination light are read out from said drain electrode and a non-selection state in which the charges are not read out, whereby, in said sense state, one of said photosensors is sequentially set up in said selection state while the other of said photosensors is set up in said non-selection state, in which a current reduced by an amount of a drain current corresponding to charges stored by application of illumination light are detected through said signal line, and in said reset state, in which charges stored are discharged; and wherein said state in which the charges generated in said semiconductor layer are held is set up when a voltage applied to said first gate electrode by said sense state controlling means is negative.

10. A photoelectric conversion system according to claim 9, wherein no impurity is doped in said third portion of said semiconductor layer, in which charges are generated in response to the illumination light.

11. A photoelectric conversion system according to claim 9, wherein said source and drain electrodes include portions for cutting out the illumination light incident to said first and second portions of said semiconductor layer.

12. A photoelectric conversion system according to claim 9, wherein said column switching means includes drain voltage supplying means for supplying a drain voltage to each of said signal lines.

13. A photoelectric conversion system according to claim 12, wherein said drain voltage supplying means includes a switching element disposed on the drain voltage input side.

14. A photoelectric conversion system according to claim 9, further comprising a plurality of driving lines arranged to extend in a direction perpendicular to said plurality of signal lines, and wherein said photosensor is arranged at a position near each of the intersections between said signal lines and said driving lines.

15. A photoelectric conversion process comprising:

a preparation step of providing a photosensor including a semiconductor layer having a photoelectric conversion function, a source electrode disposed on said semiconductor layer and connected to ground, a drain electrode separately disposed on said semiconductor layer from said source electrode, a first gate electrode which is transparent and disposed on one surface side of said semiconductor layer, and a second gate electrode disposed on the other surface side of said semiconductor layer;

a selection controlling step of applying voltages to said second gate electrode to control a selection state in which said photosensor is set for sensing and a non-selection state in which said photosensor is set for not sensing;

a sense controlling step of applying a voltage having a polarity opposite to that of said voltage in said selection state to said first gate electrode to control said semiconductor layer of said photosensor into a sense state;

a light illumination step of applying light from said first gate electrode side;

a detection step of detecting a current reduced by the drain current corresponding to an amount of said light applied to said first gate electrode; and a setting step for setting up said sense state when a voltage applied to said first gate electrode by said sense controlling step is negative.

16. A photoelectric conversion process comprising:

a preparation step of providing a photosensor array including at least one driving line, a plurality of signal lines, and photosensors arranged to correspond to said plurality of signal lines and each of said photosensors including a semiconductor layer having a photoelectric conversion function, a source electrode disposed on said semiconductor layer and connected to ground, a drain electrode separately disposed on said semiconductor layer from said source electrode and connected to a corresponding one of said signal lines, a first gate electrode which is transparent and disposed on one surface side of said semiconductor layer, and a second gate electrode disposed on the other surface side of said semiconductor layer and connected to said driving line;

a precharge step of precharging said signal lines by supplying a drain voltage to said signal lines;

a selection step of applying voltages to said second gate electrode to control a state in which said photosensor for sensing is selected from said photosensors and a state in which the other photosensor for not sensing is selected from said photosensors;

a sense controlling step of applying a voltage to said first gate electrode to control a sense state in which charges are generated in said semiconductor layer and a reset state in which charges are stored in said semiconductor layer and in which said signal lines are discharged;

a light illumination step of applying light from said first gate electrode side;

a readout step of generating charges corresponding to an amount of light applied to said photosensor in said semiconductor layer to cause a drain current; and a detection step of detecting a voltage of said signal line reduced by generation of said drain current.

17. A photoelectric conversion process according to claim 16, wherein a voltage applied to said second gate electrode in said selection step has a polarity opposite to that of a voltage applied to said first gate electrode in said sense controlling step.

* * * * *